US012751311B2

(12) United States Patent
Huang et al.

(10) Patent No.: US 12,751,311 B2
(45) Date of Patent: Sep. 29, 2026

(54) CU—CU DIRECT WELDING FOR PACKAGING APPLICATION IN SEMICONDUCTOR INDUSTRY

(71) Applicant: THE UNIVERSITY OF HONG KONG, Hong Kong (HK)

(72) Inventors: Mingxin Huang, Hong Kong (HK); Shien Ping Feng, Hong Kong (HK)

(73) Assignee: THE UNIVERSITY OF HONG KONG, Hong Kong (CN)

( * ) Notice: Subject to any disclaimer, the term of this patent is extended or adjusted under 35 U.S.C. 154(b) by 361 days.

(21) Appl. No.: 18/267,492

(22) PCT Filed: Dec. 14, 2021

(86) PCT No.: PCT/CN2021/137846
§ 371 (c)(1),
(2) Date: Jun. 15, 2023

(87) PCT Pub. No.: WO2022/127776
PCT Pub. Date: Jun. 23, 2022

(65) Prior Publication Data

US 2023/0411347 A1 Dec. 21, 2023

Related U.S. Application Data

(60) Provisional application No. 63/126,069, filed on Dec. 16, 2020.

(51) Int. Cl.
*H10W 72/00* (2026.01)
*H10W 72/20* (2026.01)
(Continued)

(52) U.S. Cl.
CPC ....... *H10W 72/073* (2026.01); *H10W 72/072* (2026.01); *H10W 72/20* (2026.01);
(Continued)

(58) Field of Classification Search
CPC ......... H01L 24/83; H01L 24/13; H01L 24/81; H01L 24/08; H01L 24/16; H01L 24/32;
(Continued)

(56) References Cited

U.S. PATENT DOCUMENTS

| | | | | |
|---|---|---|---|---|
| 10,535,626 | B2 * | 1/2020 | Uzoh | H01L 24/83 |
| 2005/0003664 | A1 | 1/2005 | Ramanathan et al. | |
| 2021/0384923 | A1 * | 12/2021 | Singh | H04B 1/123 |

FOREIGN PATENT DOCUMENTS

| | | | |
|---|---|---|---|
| CN | 106205772 | A | 12/2016 |
| CN | 109317859 | A | 2/2019 |

(Continued)

OTHER PUBLICATIONS

Liu, Chien-Min, et al. "Low-Temperature Direct Copper-to-Copper Bonding Enabled by Creep on (111) Surfaces of Nanotwinned Cu." Scientific Reports, vol. 5, No. 1, 9734, 2015, https://doi.org/10.1038/srep09734 (Year: 2015).*

(Continued)

*Primary Examiner* — Sonya McCall-Shepard
(74) *Attorney, Agent, or Firm* — Leason Ellis LLP

(57) ABSTRACT

Disclosed is a method of bonding two copper structures involving compressing a first copper structure with a second copper structure under a stress from 0.1 MPa to 50 MPa and under a temperature of 250° C. or less so that a bonding surface of the first copper structure is bonded to the bonding surface of the second copper structure. At least one of the bonding surface of the first copper structure and the bonding surface of the second copper structure have a layer of nanograins of copper having an average grain size of 5 nm to 500 nm. The layer of the nanograins of copper having a thickness of 10 nm to 10 μm.

20 Claims, 5 Drawing Sheets
(5 of 5 Drawing Sheet(s) Filed in Color)

(51) Int. Cl.

| | |
|---|---|
| ***H10W 72/30*** | (2026.01) |
| ***H10W 72/90*** | (2026.01) |
| ***H10W 80/00*** | (2026.01) |
| ***H10W 90/00*** | (2026.01) |

(52) U.S. Cl.
CPC ................. *H10W 72/07232* (2026.01); *H10W 72/07332* (2026.01); *H10W 72/07341* (2026.01); *H10W 72/252* (2026.01); *H10W 72/352* (2026.01)

(58) Field of Classification Search
CPC ........... H01L 24/29; H01L 2224/80895; H01L 2224/81895; H01L 2224/83895; H01L 2224/81203; H01L 2224/83203; H01L 2224/16145; H01L 2224/32145; H10W 72/073; H10W 72/072; H10W 72/20; H10W 72/07232; H10W 72/07332; H10W 72/07341; H10W 72/252; H10W 72/352; H10W 72/90; H10W 72/01235; H10W 72/01271; H10W 72/01335; H10W 72/01371; H10W 72/016; H10W 72/07311; H10W 72/07331; H10W 72/241; H10W 80/312; H10W 80/314; H10W 90/722; H10W 90/732; H10W 72/012; H10W 72/013; H10W 72/30
See application file for complete search history.

(56) References Cited

FOREIGN PATENT DOCUMENTS

| | | | | |
|---|---|---|---|---|
| CN | 109659272 A | 4/2019 | | |
| CN | 110085515 A | 8/2019 | | |
| WO | WO-2014119355 A1 * | 8/2014 | ............ | H01M 4/661 |

OTHER PUBLICATIONS

International Search Report an Written Opinion for International Application Serial No. PCT/CN2021/137846 mailed on Mar. 9, 2022, 6 pages.

* cited by examiner

CU—CU DIRECT WELDING FOR PACKAGING APPLICATION IN SEMICONDUCTOR INDUSTRY

CROSS-REFERENCE TO RELATED PATENT APPLICATIONS

This application is a U.S. National Phase Application under 35 U.S.C. § 371 of International Patent Application No. PCT/CN2021/137846 filed on Dec. 14, 2021 and claims the benefit of priority to U.S. Provisional Patent Application No. 63/126,069 filed on Dec. 16, 2020, the entire contents of both of which are hereby incorporated by reference herein for all purposes. The International Application was published in English on Jun. 23, 2022 as International Publication No. WO/2022/127776 A1 under PCT Article 21(2).

TECHNICAL FIELD OF THE INVENTION

Generally disclosed are methods of bonding two copper structures and specifically disclosed are methods of bonding two copper structures within a 5G chipset.

BACKGROUND OF THE INVENTION

Generally, methods for 3D-IC (integrated circuit) wafer bonding include (1) silicon fusion bonding, (2) metal-metal bonding and (3) polymer adhesive bonding. Currently, metal-metal bonding is divided to metal fusion bonding and metal eutectic bonding, for example Cu—Sn eutectic and Cu—Cu bonding. Since Cu—Cu bonding is a simpler procedure and a lower-cost alternative, it is the most popular technology for future 3D-IC packaging. Several Cu—Cu bonding technologies exist. For example, surface activated bonding with ion beam bombardment or radical irradiation pretreatment under ultrahigh vacuum and applying a noble metal as a passivation layer can be employed. However, each of these techniques involves high costs as well as time-consuming and complicated processes for mass production. In comparison, thermal compressive Cu bonding (sometimes known as Cu—Cu direct welding) is currently the superior method for implementing wafer bonding.

Cu—Cu direct welding in IC packaging is one of the most critical problems in 5G technologies. However, currently available Cu—Cu direct welding only takes place at temperatures higher than 400° C., since Cu—Cu direct welding requires higher temperatures to adequately diffuse Cu atoms for bonding. Moreover, Cu—Cu direct welding typically takes additional processing time for smooth bonding of the Cu surface due to involvement of a chemical mechanical planarization process.

SUMMARY OF THE INVENTION

The following presents a simplified summary of the invention in order to provide a basic understanding of some aspects of the invention. This summary is not an extensive overview of the invention. It is intended to neither identify key or critical elements of the invention nor delineate the scope of the invention. Rather, the sole purpose of this summary is to present some concepts of the invention in a simplified form as a prelude to the more detailed description that is presented hereinafter.

Disclosed herein are methods of bonding two copper structures involving compressing a first copper structure with a second copper structure under a stress from 0.1 MPa to 50 MPa and under a temperature of 250° C. or less so that a bonding surface of the first copper structure is bonded to a bonding surface of the second copper structure. At least one of the bonding surface of the first copper structure and the bonding surface of the second copper structure have a layer of nanograins of copper having an average grain size of 5 nm to 500 nm, the layer of the nanograins of copper having a thickness of 10 nm to 10 μm.

To the accomplishment of the foregoing and related ends, the invention comprises the features hereinafter fully described and particularly pointed out in the claims. The following description and the annexed drawings set forth in detail certain illustrative aspects and implementations of the invention. These are indicative, however, of but a few of the various ways in which the principles of the invention may be employed. Other objects, advantages and novel features of the invention will become apparent from the following detailed description of the invention when considered in conjunction with the drawings.

BRIEF SUMMARY OF THE DRAWINGS

This patent or application file contains at least one drawing executed in color. Copies of this patent or patent application publication with color drawing(s) will be provided by the Office upon request and payment of the necessary fee.

The foregoing and other objects and advantages of the present invention will become more apparent when considered in connection with the following detailed description and appended drawings in which like designations denote like elements in the various views, and wherein:

FIG. 4A is for 15 min, FIG. 4B is for 30 min.

DETAILED DESCRIPTION

Provided herein are new methods to enable Cu—Cu interface direct welding for packaging applications in the semiconductor industry. Cu samples fabricated by electrodeposition with a top layer consisting of nano-sized grains that are directly compressed by a stress of 1-20 MPa at 100-250° C. for 1-30 minutes, result in good, desirable Cu—Cu direct welding. The layer of nano-sized grains has a thickness of 10 nm to 10 μm. The nano-size grains have an average grain size of 5-100 nm.

One purpose of this invention is to solve the most critical issue in third generation packaging for 5G chips. Third generation packaging requires Cu—Cu direct welding so that electrical resistance is minimized. However, the current Cu—Cu direct welding techniques can only take place at temperatures higher than 400° C. after standard time consumable chemical mechanical planarization (CMP) processing, which is too high for the semiconductor industry as the electronic components cannot withstand such high temperatures, not to mention the time-inefficiency of CMP processing. The techniques described herein provide a method to realize Cu—Cu direct welding at low temperatures (100-250° C.), which are suitable for the semiconductor industry. The Cu—Cu direct welding techniques described herein enable a revolution for the IC packaging industry, in particular for the ICs used in 5G technology.

In the current state of the art and/or existing products, Cu components in chips in general have coarse grains or twin Cu grains so that Cu—Cu direct welding is not possible at low temperatures and low stresses. The Cu—Cu direct welding also needs the additional CMP processing as a prerequisite for a smooth surface before Cu—Cu welding. Therefore, the techniques described herein employ a metallurgy technique to carry out Cu—Cu direct welding with a smooth interface. Cu samples/components with nano-sized Cu grains have much faster diffusion rates at lower temperatures and lower stress compared to their counterparts with coarse grains or twin Cu structures. This is one of the unique features of the present invention.

Part of developing a practical product involves demonstrating good interface grain growth after the Cu—Cu direct welding in accordance with the techniques of the present invention without standard CMP processing. Demonstrating good interface grain growth is generally required since interface bonding is a critical point for IC packing, as a general concern. For that purpose, the step of depositing an ultrasmooth activated Cu nano grain layer is an important act. With such deposition lower welding temperatures and lower stress with a good interface is achieved. It is noted that various chemical additives to a Cu electrodeposition electrolyte can further optimize the methods described herein.

Figure 1:
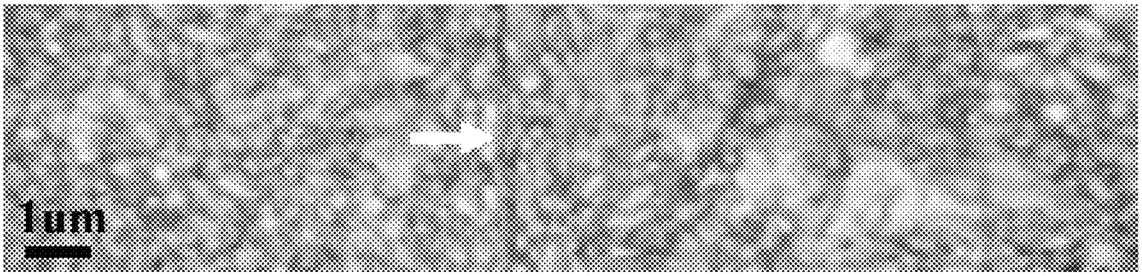
FIG. 1 depicts a band contrast image showing the desirable adhesion of a Cu—Cu interface in accordance with the methods described herein, where a white arrow indicates the interface.
Figure 2:
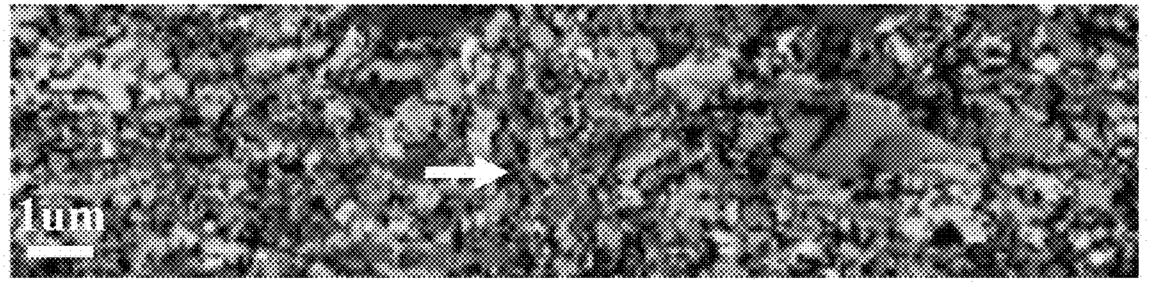
FIG. 2 depicts an inverse pole figure of an electron backscatter diffraction (EBSD) image showing a desirable adhesion of an Cu—Cu interface in accordance with the methods described herein, where a white arrow indicates the interface.

Two Cu films with a top layer of nanograins were fabricated by electrodeposition. These two Cu films were subjected to direct contact with a compression stress of 20 MPa at 200° C. for 10 minutes, and showed excellent adhesion. FIG. 1 shows the interface (pointed to by the white arrow) between the two Cu films by band contrast image of electron backscatter diffraction (EBSD). FIG. 2 is the inverse pole figure of EBSD at the same area. From FIGS. 1 and 2, Cu—Cu direct welding is successful between the two Cu films with a top layer of nanograins.

Generally speaking, two copper surfaces (two copper structures) are bonded together. By copper structure or surface, the structure (or the surface of the structure being bonded) contains copper. In one embodiment, the copper structure contains at least 50% by weight copper. Examples include structures that are pure copper, substantially pure copper, copper-copper oxide structures, and copper alloys. For purposes herein, pure copper means a structure that contains at 99.9% by weight copper, and substantially pure copper contains at least 98% by weight copper. Other metals that can be included in a copper alloy include one or more of aluminum (Al), gold (Au), silver (Ag), tungsten (W), platinum (Pt), palladium (Pd), nickel (Ni), zinc (Zn), titanium (Ti), and the like. The two copper structures bonded together can be the same or different (both copper structures substantially pure copper; or one copper structure substantially pure copper and the other copper structure a copper alloy).

The copper structures to be bonded together are optionally cleaned before the bonding process. For example, the copper structures are exposed to a water-acid mixture (for instance, $H_2O$:HCl), ethanol, and/or acetone for a suitable period of time at room temperature. Alternatively, the copper structures are exposed to methanol vapor to clean the surface. Following this operation, the copper structures are rinsed in distilled (DI) water and then dried. Precleaning typically results in clean copper surfaces, having no native oxide or other contaminants thereon.

Of the two copper surfaces/structures bonded together, at least one of the two copper surfaces/structures has a top layer (that is, the surface that is bonded or the interface surface) of nanograins of copper. For copper surfaces/structures that are pure copper, substantially pure copper and copper alloys, the top layer contains nanograins of copper. For copper surfaces/structures that are copper alloys, the top layer alternatively contains nanograins of copper and the alloy metal(s). Although at least one of the two copper surfaces/structures has a top layer of nanograins of copper, in another embodiment, both of the two copper surfaces/structures have a top layer of nanograins of copper. In embodiments where both of the two copper surfaces/structures have a top layer of nanograins of copper, the two top layers can be the same or different (that is, the average grain size and the layer thickness can be the same or different when comparing the two top layers).

The nanograins of copper have an average grain size that facilitates a good, desirable Cu—Cu direct weld under compression. In one embodiment, the nanograins of copper have an average grain size of 5 nm to 500 nm. In another embodiment, the nanograins of copper have an average grain size of 10 nm to 250 nm. In yet another embodiment, the nanograins of copper have an average grain size of 15 nm to 100 nm. The nanograins of copper have a layer thickness that facilitates a good, desirable Cu—Cu direct weld under compression. In one embodiment, the layer of the nano-sized grains of copper has a thickness of 10 nm to 10 μm. In another embodiment, the layer of the nano-sized grains of copper has a thickness of 25 nm to 5 μm. In yet another embodiment, the layer of the nano-sized grains of copper has a thickness of 50 nm to 1 μm.

The Cu—Cu welding techniques of the present invention include applying a suitable compression stress directly to the two copper structures to result in a good, desirable Cu—Cu direct weld. In one embodiment, the two copper structures are compressed by a stress from 0.1 MPa to 50 MPa. In another embodiment, the two copper structures are compressed by a stress from 1 MPa to 20 MPa. In yet another embodiment, the two copper structures are compressed by a stress from 2 MPa to 10 MPa.

The Cu—Cu welding techniques of the present invention include contacting the two copper structures under a suitably low temperature to result in a good, desirable Cu—Cu direct weld. In one embodiment, the two copper structures are welded under a temperature from 100° C. to 250° C. In another embodiment, the two copper structures are welded under a temperature from 120° C. to 200° C. In yet another embodiment, the two copper structures are welded under a temperature from 140° C. to 175° C. As used herein, low temperature means 250° C. or less.

The Cu—Cu welding techniques of the present invention include contacting the two copper structures for a time sufficient to result in a good, desirable Cu—Cu direct weld. In one embodiment, the two copper structures are welded for a time from 0.5 to 60 minutes. In another embodiment, the two copper structures are welded for a time from 1 to 30 minutes. In yet another embodiment, the two copper structures are welded for a time from 2 to 15 minutes.

The Cu—Cu welding techniques include contacting the two copper structures in an air atmosphere, an oxygen-free atmosphere, a nitrogen atmosphere, a nitrogen-rich atmosphere, a noble gas atmosphere, an argon atmosphere, or under a vacuum.

One advantage associated with the Cu—Cu welding techniques of the present invention is that a CMP process (of cleaning a copper surface, preparing a copper surface for bonding, etc.) is unnecessary. CMP processing can be expensive and/or time consuming, so avoiding such processing achieves advantages in efficiency. In one embodiment of the Cu—Cu welding techniques described herein, no CMP is performed. It is noted that various forms of CMP are often used in semiconductor processing, so when in some embodiments no CMP is performed, it means that no CMP is performed for purposes of bonding copper structures together.

Thus, an efficient and simple method to achieve the direct Cu—Cu welding by depositing copper layer with different nanograin size on the bonding interface is described herein. First, the methods herein demonstrate the smoother Cu surface before Cu—Cu welding which is much more time-efficient than the currently available techniques that need the standard chemical mechanical planarization process to decrease the roughness. Second, the methods herein can easily achieve Cu diffusion under such lower bonding temperature, since the methods exhibit lower energy for activating the surface Cu atoms and attain Cu—Cu bonding directly.

Figure 3:
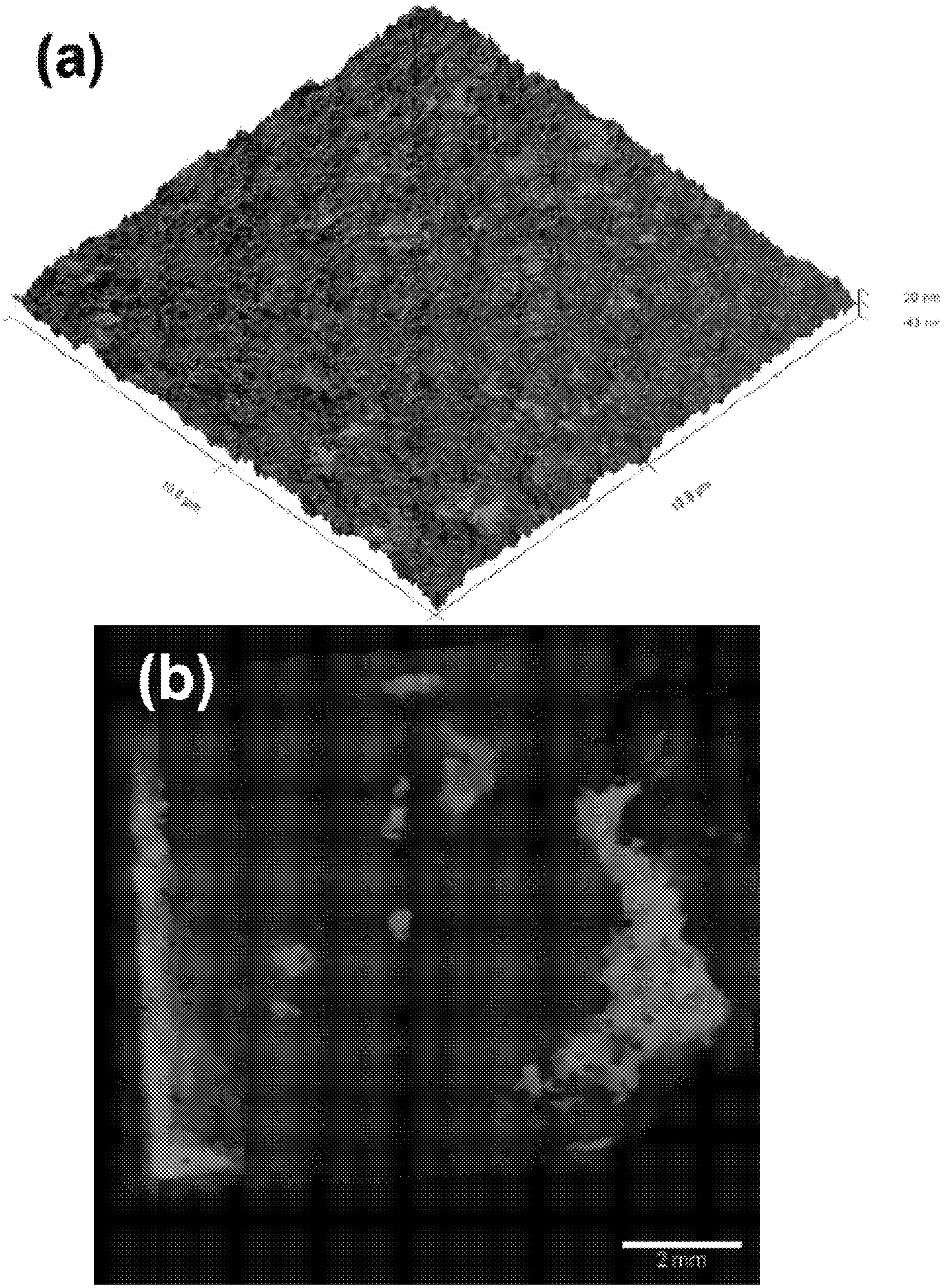
FIG. 3A shows a 3D image of a surface topography of an as deposited nanocrystalline Cu sample.
FIG. 3B is a SAM image of a sample after bonding where the dark region indicates a bonded area and the bright region indicates potential cracks, defects, voids or unbonded sites.
Figure 4:
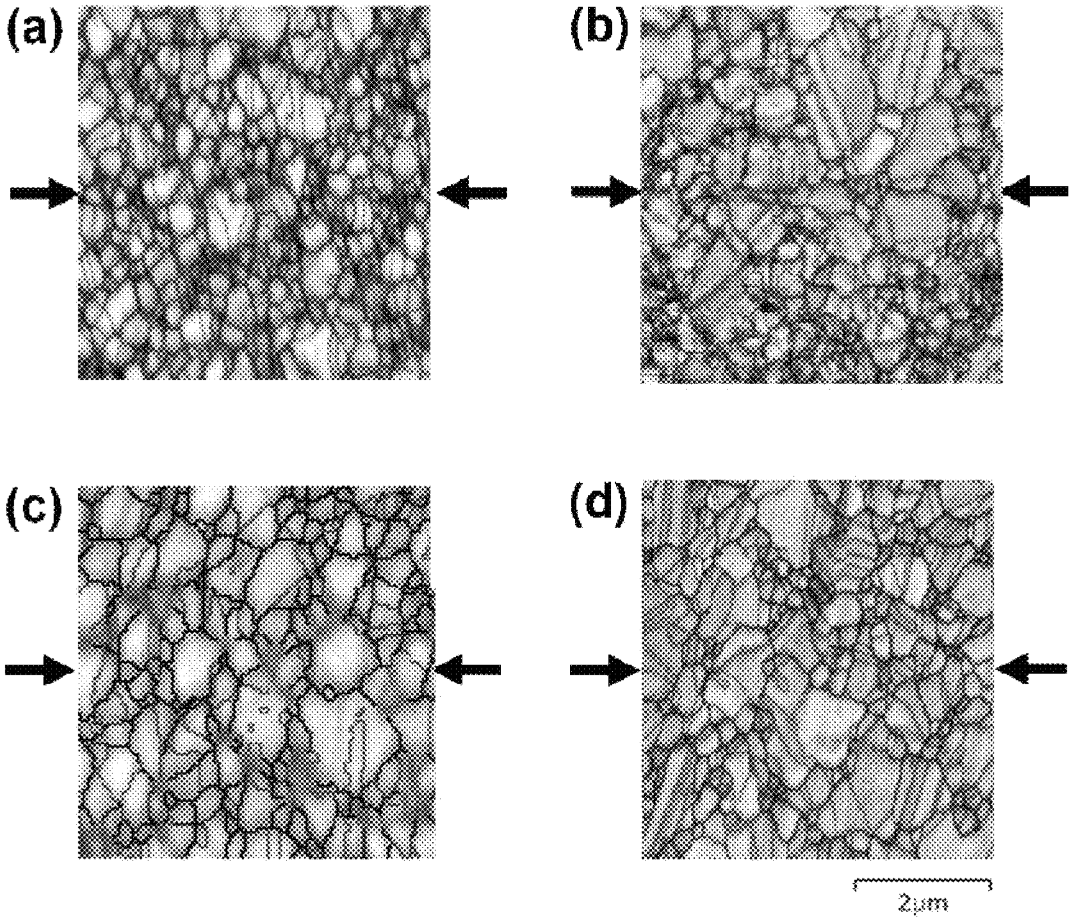
FIGS. 4A-B show the band contrast image showing a good adhesion interface between Cu surfaces with different bonding durations, where
FIG. 4C is for 45 min and FIG. 4D is for 60 min, where the Black arrows indicate the (original) bonding interface.

Two pieces of Si wafers were electroplated with a thin layer of nanocrystalline grain copper using commercially available electrolyte. The applied current density was 40 $mA/cm^2$ resulting in a deposition rate of 900 nm/s. An approximately 3 μm deposition layer was fabricated on each piece in 200 s. A magnetic stirrer was used with a constant speed of 400 rpm. The two pieces of deposited wafer were ultrasonically cleaned in the following sequence: ethanol, acetone, diluted hydrochloric acid. The surface roughness value ($R_a$) of an as-deposited sample was tested using Atomic Force Microscope (AFM) and was found to be 6.5 nm as shown by FIG. 3A, similar to that of a Chemical-Mechanical-Polished (CMP) surface ($R_a$=2.2 nm). Two as-deposited pieces were put into contact without any polishing processes, and thermocompression was performed in a low vacuum ($5\times10^{-4}$ mbar) at 250° C. for 15-60 min with a stress of 10 MPa. FIG. 3B shows the result from a scanning acoustic microscope (SAM) over the full sample area (1 cm×1 cm). The dark regions correspond to sites with good contact, i.e. bonded regions. The percentage of bonding area is approximately 87%, which shows an excellent process yield. FIGS. 4A-D show band contrast images generated using electron backscatter diffraction (EBSD) for the interface of the bonded samples with the duration of 15 min (FIG. 4A), 30 min (FIG. 4B), 45 min (FIG. 4C), and 60 min (FIG. 4D), respectively. The images clearly demonstrated a high-quality bonding formed with only 15 mins bonding and the interface becomes indistinguishable after 60 mins.

Figure 5:
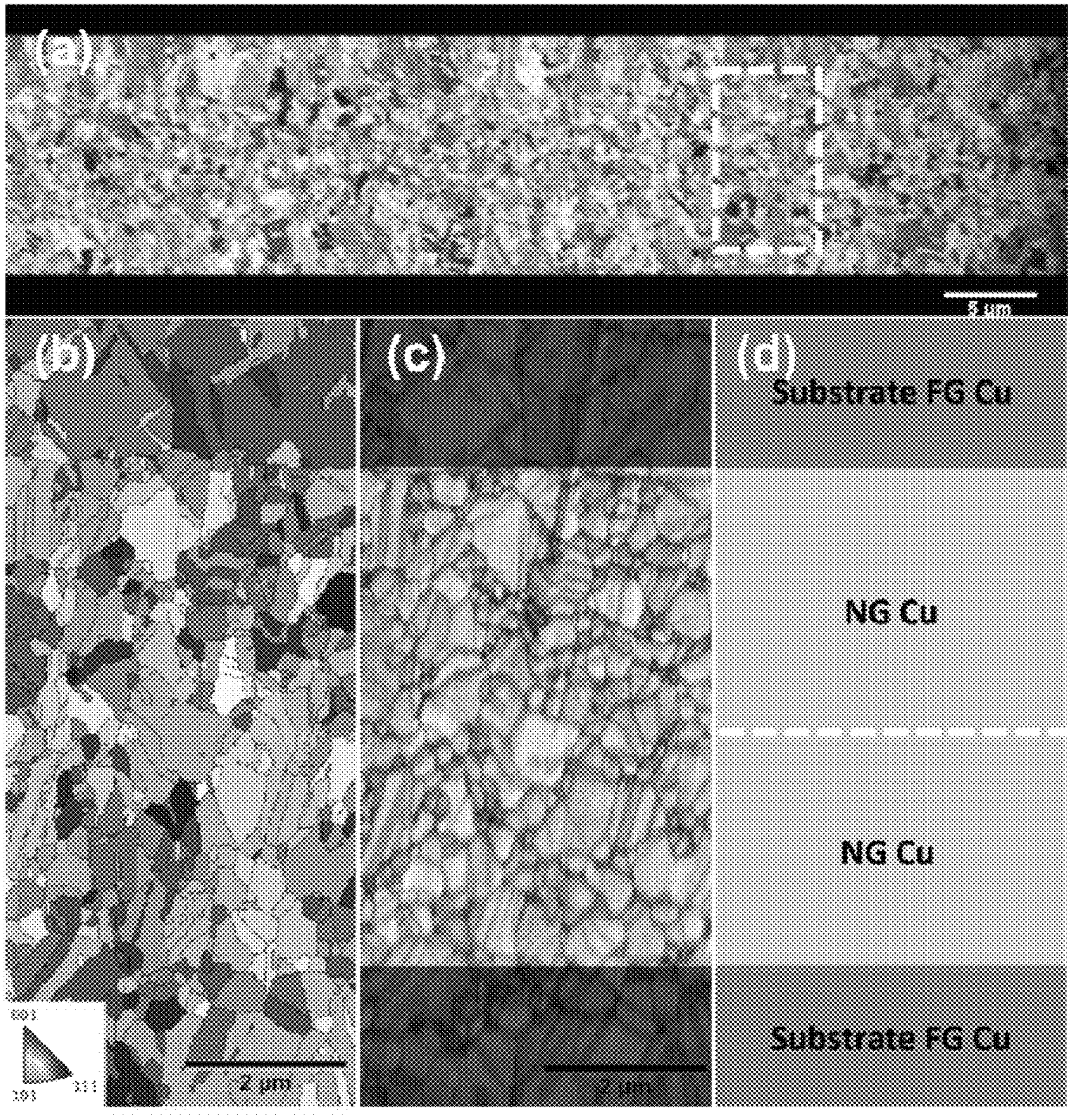
FIG. 5A illustrates a scanning ion microscope (SIM) image of the bonding cross section for sample bonding at 250° C. for 60 min with 10 MPa.
FIG. 5B is the inverse pole figure mapping corresponds to the boxed region.
FIG. 5C is the band contrast image and FIG. 5D is a schematic sketch of the interface region.
Figure 6:
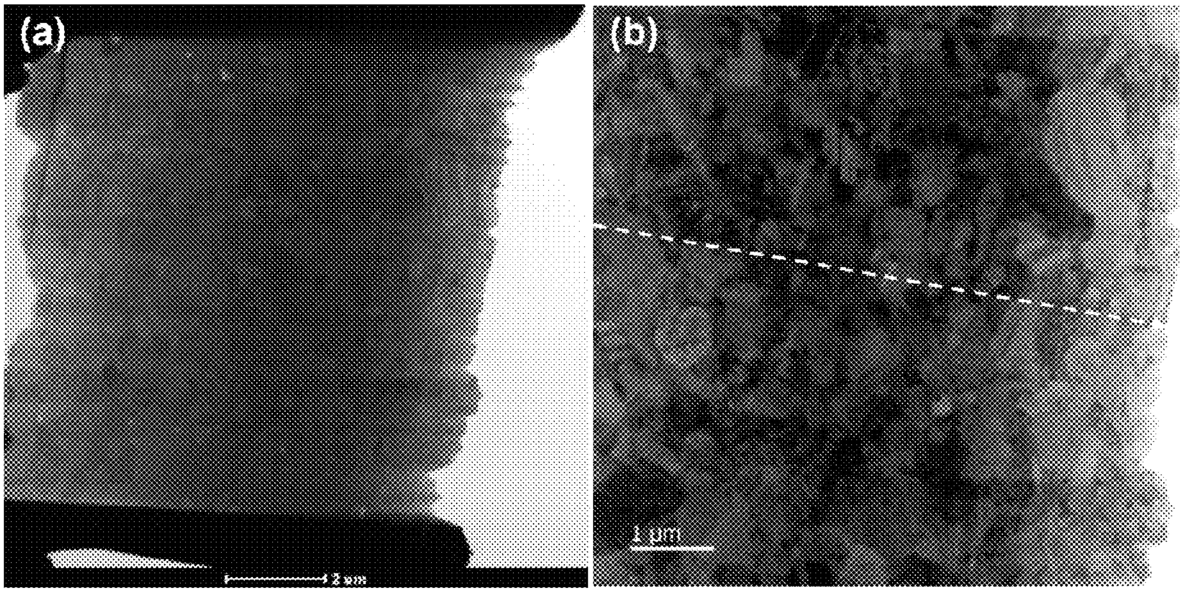
FIG. 6A illustrates a bright-field TEM image of the bonded sample interface without macroscopic defects.
FIG. 6B is an enlarged view of the interfacial region with a white arrow showing the position of original interface that became indistinguishable in this sample.

FIG. 5A presents the scanning ion microscope (SIM) image of a continuous cross-section over around 80 μm, showing that the elimination of interface for bonding at 250° C. for 60 min is not a local phenomenon, but homogeneous over an extended length. FIG. 5B is the inverse pole figure mapping corresponds to the boxed region, FIG. 5C is the band contrast image and FIG. 5D is a schematic sketch of the interface region. A transmission electron microscope (TEM) image of the same sample has further proved that the bonding is of excellent quality as illustrated in FIG. 6, wherein FIG. 6A illustrates a bright-field TEM image of the bonded sample interface without macroscopic defects, and FIG. 6B is an enlarged view of the interfacial region with a white arrow showing the position of original interface that became indistinguishable in this sample. A closer view at the interface region shows that the interface is free of observable cracks, defects and unbonded sites.

Figure 7:
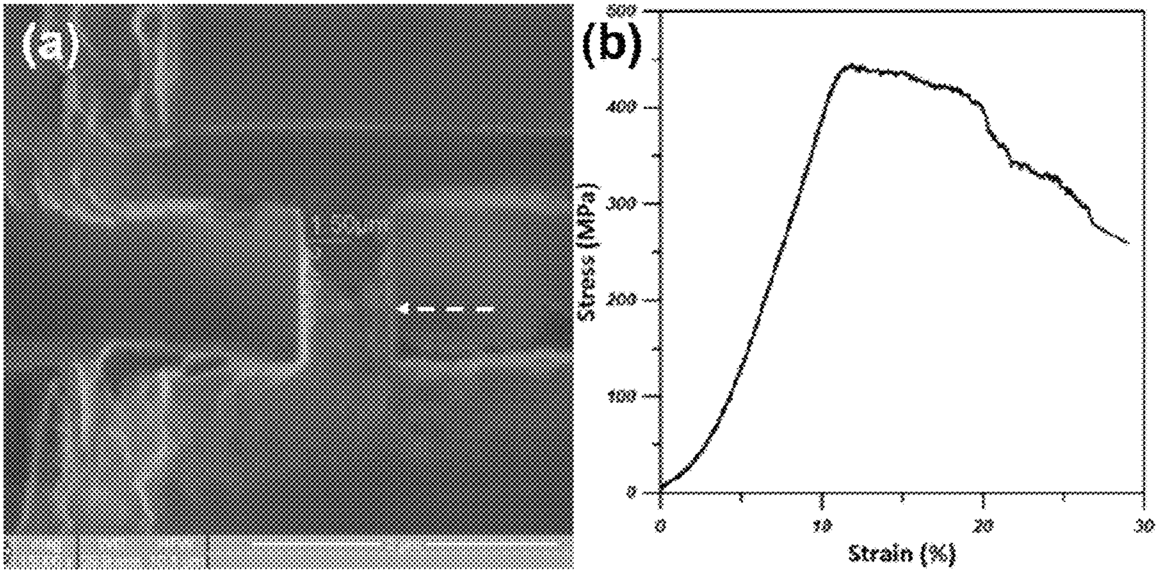
FIG. 7A shows a sample used for micro tensile testing with the interface indicated by a white arrow and FIG. 7B is the resultant stress-strain curve.

Micromechanical testing was performed on the interfacial region to accurately assess the interface strength. FIG. 7A shows a sample used for micro tensile testing with the interface indicated by a white arrow. FIG. 7B shows the stress-strain curve of the sample with a dimension of 1.5 μm×1.5 μm×2.5 μm in the micro-tensile test. The yield strength of the interface is over 400 MPa and the elongation to failure is nearly 30% indicating excellent ductile mechanical behavior.

Unless otherwise indicated in the examples and elsewhere in the specification and claims, all parts and percentages are by weight, all temperatures are in degrees Centigrade, and pressure is at or near atmospheric pressure.

With respect to any figure or numerical range for a given characteristic, a figure or a parameter from one range may be combined with another figure or a parameter from a different range for the same characteristic to generate a numerical range.

Other than in the operating examples, or where otherwise indicated, all numbers, values and/or expressions referring to quantities of ingredients, reaction conditions, etc., used in the specification and claims are to be understood as modified in all instances by the term "about."

While the invention is explained in relation to certain embodiments, it is to be understood that various modifications thereof will become apparent to those skilled in the art upon reading the specification. Therefore, it is to be understood that the invention disclosed herein is intended to cover such modifications as fall within the scope of the appended claims.

What is claimed is:

1. A method of directly bonding two copper structures, comprising: compressing a first copper structure with a second copper structure under a stress from 1 MPa to 20 MPa and under a temperature from 100° C. to 250° C. so that a bonding surface of the first copper structure is bonded to a bonding surface of the second copper structure;

at least one of the bonding surface of the first copper structure and the bonding surface of the second copper structure has a layer of nanograins consisting of copper having an average grain size of 5 nm to 500 nm, and chemical additives of copper electrodeposition electrolyte, the layer of the nanograins of copper having a thickness of 10 nm to 10 μm.

2. The method according to claim 1, wherein both the bonding surface of the first copper structure and the bonding surface of the second copper structure have a layer of nanograins of copper having an average grain size of 5 nm to 500 nm, the layer of the nanograins of copper having a thickness of 10 nm to 10 μm.

3. The method according to claim 1, wherein the nanograins of copper have an average grain size of 10 nm to 250 nm.

4. The method according to claim 2, wherein the nanograins of copper have an average grain size of 10 nm to 250 nm.

5. The method according to claim 1, wherein the nanograins of copper have an average grain size of 10 nm to 250 nm.

6. The method according to claim 2, wherein the nanograins of copper have an average grain size of 15 nm to 100 nm.

7. The method according to claim 1, wherein the first copper structure and the second copper structure are compressed under a temperature from 120° C. to 200° C.

8. The method according to claim 1, wherein the first copper structure and the second copper structure are compressed for a time from 0.5 to 60 minutes.

9. The method according to claim 1, with the proviso that a CMP process associated with the method of bonding two copper structures is not conducted.

10. A method of directly bonding two copper structures within a 5G wireless chipset, comprising: compressing a first copper structure within a wireless chipset with a second copper structure within a wireless chipset under a stress from 1 MPa to 20 MPa and under a temperature from 100° C. to 250° C. so that a bonding surface of the first copper structure is bonded to a bonding surface of the second copper structure;

at least one of the bonding surface of the first copper structure and the bonding surface of the second copper structure has a layer of nanograins consisting of copper having an average grain size of 5 nm to 500 nm, and chemical additives of copper electrodeposition electrolyte, the layer of the nanograins of copper having a thickness of 10 nm to 10 μm.

11. The method according to claim 10, wherein both the bonding surface of the first copper structure and the bonding surface of the second copper structure have a layer of nanograins of copper having an average grain size of 5 nm to 500 nm, the layer of the nanograins of copper having a thickness of 10 nm to 10 μm.

12. The method according to claim 10, wherein the nanograins of copper have an average grain size of 10 nm to 250 nm.

13. The method according to claim 11, wherein the nanograins of copper have an average grain size of 10 nm to 250 nm.

14. The method according to claim 10, wherein the nanograins of copper have an average grain size of 10 nm to 250 nm.

15. The method according to claim 11, wherein the nanograins of copper have an average grain size of 15 nm to 100 nm.

16. The method according to claim 10, wherein the first copper structure and the second copper structure are compressed under a temperature from 120° C. to 200° C.

17. The method according to claim 10, wherein the first copper structure and the second copper structure are compressed for a time from 0.5 to 60 minutes.

18. The method according to claim 10, with the proviso that a CMP process associated with the method of bonding two copper structures is not conducted.

19. The method according to claim 1, wherein the layer of nanograins of copper has a thickness of 25 nm to 5 μm.

20. The method according to claim 1, wherein the layer of nanograins of copper have a thickness of 50 nm to 1 μm.

* * * * *